US006888208B2

United States Patent
Osipov et al.

(10) Patent No.: US 6,888,208 B2
(45) Date of Patent: May 3, 2005

(54) SQUARE-LAW DETECTOR BASED ON SPIN INJECTION AND NANOWIRES

(75) Inventors: Viatcheslav V. Osipov, Mountain View, CA (US); Alexandre M. Bratkovski, Mountain View, CA (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/631,951

(22) Filed: Jul. 30, 2003

(65) Prior Publication Data

US 2005/0023519 A1 Feb. 3, 2005

(51) Int. Cl.[7] .............................................. H01L 29/82
(52) U.S. Cl. ..................... 257/421; 257/30; 257/188; 257/295; 257/422
(58) Field of Search .............................. 257/13, 21, 25, 257/30, 85, 188, 295, 421, 422, 423, 425, 426, 427, 441; 365/174, 177, 182; 360/324

(56) References Cited

U.S. PATENT DOCUMENTS

| | | | | |
|---|---|---|---|---|
| 5,565,695 A | * | 10/1996 | Johnson ...................... | 257/295 |
| 5,874,749 A | * | 2/1999 | Jonker ......................... | 257/98 |
| 5,966,012 A | * | 10/1999 | Parkin ......................... | 324/252 |
| 6,624,490 B2 | * | 9/2003 | Flatte et al. ................. | 257/421 |
| 2002/0043974 A1 | * | 4/2002 | Sato et al. ................... | 324/252 |
| 2003/0042562 A1 | * | 3/2003 | Giebeler et al. ............ | 257/421 |

OTHER PUBLICATIONS

Sarma, Sankar Das, "Spintronics" American Scientist, vol. 89, pp. 516–523 (Nov.–Dec. 2001).
Wolf, S.A. et al., "Spintronics: A Spin–Based Electronics Vision for the Future" Science, vol. 294, pp. 1488–1495 (Nov. 16, 2001).

* cited by examiner

*Primary Examiner*—Tom Thomas
*Assistant Examiner*—N. Drew Richards

(57) ABSTRACT

Ultrafast square-law detectors amplify electric currents and electromagnetic waves with frequencies on the order of 100 GHz or more. The detectors use injection of spin-polarized electrons from a magnetic film or region into another magnetic film or region through a thin semiconductor control region. A signal current flowing through a conductive nanowire induces a magnetic field causing precession of electron spin injected inside the semiconductor layer and thereby changing the conductivity of the detector. With the magnetizations of the magnetic regions being parallel or antiparallel to each other, the resulting spin injection current includes a term proportional to the square of the signal current so that the detector behaves as a square-law detector. Such square-law detectors are magnetic-semiconductor heterostructures and can operate as a frequency doubler for millimeter electromagnetic waves.

37 Claims, 6 Drawing Sheets

SQUARE-LAW DETECTOR BASED ON SPIN INJECTION AND NANOWIRES

This patent document is related and hereby incorporates by reference in their entirety U.S. patent application Ser. No. 10/284,183, filed Oct. 31, 2002, entitled: "Efficient Spin-Injection Into Semiconductors"; U.S. patent application Ser. No. 10/284,360, filed Oct. 31, 2002, entitled: "Magnetic Sensor Based on Efficient Spin Injection into Semiconductors"; co-filed U.S. patent application Ser. No. 10/631,999, entitled "Spin Injection Devices"; and co-filed U.S. patent application Ser. No. 10/632,038, entitled "Amplifiers Using Spin Injection And Magnetic Control Of Spin Direction."

BACKGROUND

Traditional semiconductor devices based on control of the flow and the density of electric charge (e.g., electrons or holes) are nearing a point where every new step towards miniaturization or towards increasing the operating speed demands new technology and huge investments. In particular, as semiconductor devices become smaller (e.g., near nanometer scale) or need to operate at faster speeds, the heat that electrical currents generate in semiconductor devices becomes a greater problem. Additionally, semiconductor devices are now reaching sizes at which previously ignored quantum-mechanical properties such as spin are significant. Dealing with these quantum-mechanical properties can be a challenge in the design of traditional semiconductor devices, but such quantum mechanical properties also provide the potential for alternative mechanisms for device operation.

One important quantum property of electrons is their intrinsic spin. The spin of an electron gives the electron an intrinsic magnetic moment that can interact with electromagnetic fields. The spin interactions of electrons therefore provide a potential mechanism for operational devices, and such devices can be very fast and potentially generate less heat than do traditional devices. The field of spintronics has thus arisen from efforts to develop fast solid-state devices such as transistors, amplifiers, and magnetic sensors of nanometer proportions that use the spins or the associated magnetic moments of electrons.

S. Datta and B. Das in "Electronic Analog of the Electrooptic Modulator," Applied Physics Letters, Vol. 56, p. 665, proposed a spin transistor based on the spin-orbital coupling of electrons to a gated electric field. Other types of spintronic devices are now sought to provide fast operation, low heat generation, and scalability down to nanometer sizes.

SUMMARY

In accordance with an aspect of the invention, ultrafast devices such as square-law detectors handle input signals having frequencies up to 100 GHz or more and generate output signals including a component proportional to the square of the sum of the input signals. The devices inject spin-polarized electrons from one magnetic layer into another magnetic layer through a semiconductor layer. The spins of electrons traversing the semiconductor layer precess under the action of the magnetic field induced by a current flowing through highly conductive adjacent nanowire. Magnetizations in the magnetic layers are preferably parallel or anti-parallel to produce a device with square-law performance.

BRIEF DESCRIPTION OF THE DRAWINGS

Use of the same reference symbols in different figures indicates similar or identical items.

DETAILED DESCRIPTION

In accordance with an aspect of the invention, a square-law detector having a magnetic-semiconductor-magnetic heterostructure uses injection of spin-polarized electrons from one magnetic region through a semiconductor control region into another magnetic region while signal currents through a nearby nanowire induce a magnetic field in the control region. The magnetic field rotates the spins of the electrons and changes the conductivity between the two magnetic regions. An output signal corresponding to current flow between the two magnetic regions has a component proportional to the square of a sum of the signal currents when fixed magnetizations in the two magnetic regions are substantially collinear, i.e., substantially parallel or substantially antiparallel to each other.

Figure 1A:
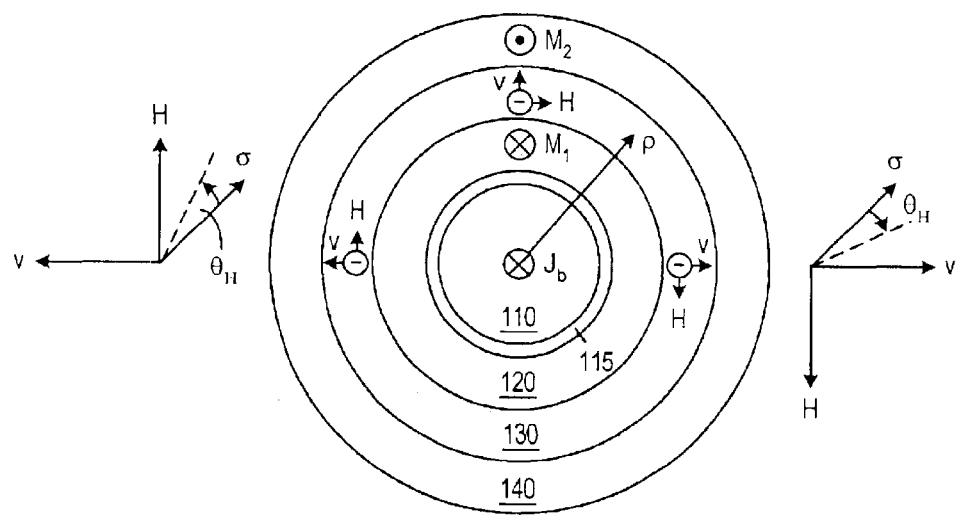
FIGS. 1A and 1B respectively show a cross-sectional view and a perspective view of a radially symmetrical square-law detector in accordance with an embodiment of the invention.
Figure 1B:
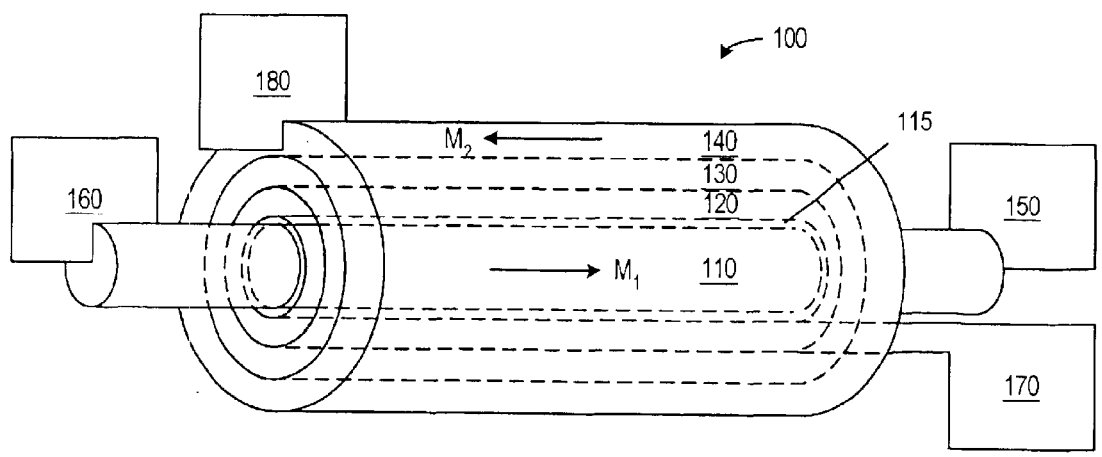

FIGS. 1A and 1B show a square-law detector 100 in accordance with an embodiment of the invention that uses a magnetic field from a current through a nanowire 110 to control rotation of spin-polarized electrons that are injected through a control region. Square-law detector 100 is cylindrically symmetric about nanowire 110 and is described here primarily to illustrate the operating principles of a spin injection square-law detector. Square-law detectors in accordance with embodiments of the invention that are easier to manufacture are described further below.

As shown in FIGS. 1A and 1B, detector 100 includes nanowire 110, which is encircled by a first magnetic layer 120, a semiconductor layer 130, and a second magnetic layer 140. Semiconductor layer 130 forms the control region through which spin-polarized electrons are injected between magnetic layers 120 and 140. Terminals 150, 160, 170 and 180 allow application of bias voltages that cause a signal or base current $J_b$ in nanowire 110 and the injection current (sometimes referred to herein as the emitter current) $J_e$ through semiconductor layer 130. In particular, electrical terminals 150 and 160 contact the face planes (or ends) of nanowire 110, and electrical terminals 170 and 180 contact magnetic layers 120 and 140, respectively. A thin dielectric layer 115 is preferably but optionally between nanowire 110 and magnetic layer 120. Importantly, when dielectric layer 115 is employed, base current $J_b$ in nanowire 110 is independent of the biasing of or the current through magnetic layer 120.

Magnetic layers 120 and 140 have permanent magnetizations $M_1$ and $M_2$, respectively. In the configuration of FIG. 1A, magnetization $M_1$ in magnetic layer 120 is parallel to the symmetry axis of nanowire 110, and magnetization $M_2$ in magnetic layer 140 is antiparallel to magnetization $M_1$. Alternatively, magnetization $M_2$ can be parallel to magnetization $M_1$. These magnetization directions can be realized, for example, when thicknesses of the cylindrical magnetic layers 120 and 140 are equal to or less than the width $L_0$ of domain walls in the magnetic materials in layers 120 and 140. The magnetizations $M_1$ and $M_2$ are directed along the axes of the cylindrical films 120 and 140. Other configurations in which magnetizations $M_1$ and $M_2$ are at a relative angle that provides significant parallel or antiparallel components of magnetizations $M_1$ and $M_2$ may also be suitable.

Magnetic layers 120 and 140 can be biased so that electrons flowing through semiconductor layer 130 have a drift velocity v that is directed radially away from or toward magnetic layer 120. An initial spin direction a of the electrons depends on the magnetization of magnetic layer 120 or 140 providing conduction electrons that are injected through semiconductor layer 130. FIG. 1A shows the relative directions of drift velocity v and spin σ of electrons from magnetic layer 120 relative to a magnetic field H induced by a base current $J_b$ flowing along nanowire 110 into the page of FIG. 1A.

Nanowire 110 is a highly conductive wire that may be formed from various highly conductive materials including heavily doped silicon or poly-silicon and metals such as aluminum (Al), copper (Cu), silver (Ag), gold (Au), platinum (Pt), and tungsten (W) to name a few.

Magnetic layers 120 and 140 may each be formed from various magnetic materials including: ferromagnetic elements iron (Fe), cobalt (Co), and nickel (Ni), various magnetic alloys and compounds, which may include one or a combination of Fe, Co, Ni, $CrO_2$ and $Fe_3O_4$; and magnetic semiconductors including but not limited to GaAs:Mn, GaN:Mn, ZnO, $CaB_6$, and $Ca_{1-x}La_xB_6$.

Semiconductor layer 120 may be formed from various semiconductor materials including Si, Ge, GaAs, ZnTe, GaSb, GaP, InAs, CdSe, InP, InSb, CdTe, CdS, ZnS, ZnSe, AlP, AlAs, AlSb and also alloys and combinations of these materials. For reasons discussed below, semiconductor layer 120 is preferably formed from a material providing a relatively large time $\tau_S$ of electron spin relaxation such as GaAs, GaInAs, Ge, Si, ZnSe and ZnCdSe and preferably has a negative doping.

Square-law detector 100 operates based on the injection of spin-polarized electrons from one magnetic layer, e.g., magnetic layer 120, into the other magnetic layer, e.g., magnetic layer 140, through semiconductor layer 130. Current flowing along the nanowire 110 induces a magnetic field H inside semiconductor layer 130 that causes precession of the spin σ of the electrons traversing semiconductor layer 130.

For operation of square-law detector 100, a base voltage $V_b$ is applied between electrical contacts 150 and 160, and an emitter voltage $V_c$ is applied between electrical contacts 170 and 180. These voltages can have arbitrary polarity. For definiteness, the following description describes the case where contacts 150 and 170 are grounded and voltages $V_b$ and $V_c$ on terminals 160 and 180, respectively, are positive. In this case, spin-polarized electrons under the action of positive emitter voltage $V_c$ will be injected from magnetic layer 120 through the semiconductor layer 130 into magnetic layer 140.

Dielectric layer 115 isolates nanowire 110 from magnetic layer 120, so that a base circuit (e.g., terminal 160, nanowire 110, and terminal 150) for base current $J_b$ is electrically separated from an emitter circuit (e.g., terminal 180, magnetic layer 140, semiconductor layer 130, magnetic layer 120, and terminal 170) for emitter current $J_c$. The conductivity of the emitter circuit is much higher than the conductivity of the base circuit due to the geometry of detector 100, i.e., the much larger area of the current carrying path through semiconductor layer 130 as shown in FIG. 1B. In particular, nanowire 110 may have a diameter on the order of a few tens of nanometers, while magnetic layer 140 has a length and a width that are on the order of one micron or more.

Detector 100 controls injection of spin-polarized electrons through semiconductor layer 130, and therefore requires that the spin of the electrons predominantly remain coherent during transit across semiconductor layer 130. Accordingly, a transit time $\tau_T$ of the electrons traversing semiconductor layer 130 should not exceed the spin-relaxation time $\tau_S$, i.e., the time of spin coherence of electrons in semiconductor layer 130. In other words, spin ballistic transport is desired. Theoretical calculations and experimental studies indicate that the longest values for spin-relaxation time $\tau_S$ can be realized in negatively-doped (i.e., n-type) semiconductors and can reach up to 1 ns in materials such as ZnSe and GaAs at room temperature.

Transit time $\tau_T$ for electrons crossing semiconductor layer 130 is equal to the ratio of the thickness d of semiconductor layer 130 and the drift velocity v of the electrons traversing semiconductor layer 130. The drift velocity v in turn depends on the applied electric field E, the electron mobility $\mu_n$ and the diffusion constant $D_n$ in semiconductor layer 130 as indicated in Equation (1) below. From Equation (1), the condition that transit time $\tau_T$ be less than spin-relaxation time $\tau_S$ limits the maximum thickness $d_{max}$ of semiconductor layer 130 for spin ballistic transport as indicated in Equation (2). The maximum thickness $d_{max}$ is typically less than about 1 μm for a suitable semiconductor material such as n-type ZnSe or GaAs, but to provide even faster operation, the thickness d of semiconductor layer 130 between magnetic layers 120 and 140 is preferably greater than about 10 nm but less than about 100 nm.

$$v = \mu_n \bar{E} + D_n/d \tag{1}$$

$$\tau_t \leq \tau_s, \text{ or } d < d_{max} = \sqrt{D_{n\tau_s}} + \tau_s \mu_n E \tag{2}$$

Transit time $\tau_T$, determines the operating speed of the device. In particular, the maximum operating frequency $\omega_0 = 2\pi f_0$ of the device is about $2\pi/\tau_T$. With transit time $\tau_T$ typically being less than 0.01 ns when semiconductor layer 130 is about 10 nm thick, an operating frequency $\omega_0$ greater than 100 GHz can be achieved.

The conductivity G between magnetic layers 120 and 140, i.e., between electrical terminals 170 and 180, generally depends on an angle θ between spin directions of electrons incident on the interface between semiconductor layer 130 and the magnetic layer 120 or 140 into which the electrons are to be injected. Equation (3) indicates the conductivity G between magnetic layers 110 and 130 when the electrons traversing layer semiconductor 130 remain coherent. In particular, Equation (3) is valid when semiconductor layer 130 is relatively thick and the spin ballistic transport is realized, i.e., the condition of Equation (2) is fulfilled. In Equation (3), parameters $P_1$ and $P_2$ represent the degrees of spin polarizations of currents crossing the first and second magnetic-semiconductor (M-S) interfaces. Thus, parameter $P_1$ represents the spin polarization of electrons entering semiconductor layer 130 from magnetic layer 120, and parameter $P_2$ represents the spin polarization of the spin-polarized electrons entering semiconductor layer 130 from magnetic layer 140. Angle θ is the angle between the spin σ of the injected spin-polarized electrons in semiconductor layer 130 near the magnetic layer 140 and the magnetization $M_2$ in the magnetic layer 130.

$$G=G_0(1+P_1P_2 \cos θ)=G_0[1+P_1P_2 \cos(θ_0+θ_H)] \quad (3)$$

Magnetization $M_1$ in magnetic layer 120 determines the direction of spin-polarized conduction electrons injected into semiconductor layer 130 from the magnetic layer 120. Absent spin rotation in semiconductor layer 130, angle θ is equal to the angle $θ_0$ between magnetizations $M_1$ and $M_2$, which is 180° for the magnetization directions illustrated in FIGS. 1A and 1B. The illustrated embodiment of FIG. 1A thus provides a minimum conductivity $G_0(1-P_1P_2)$ if the electrons retain their spin when crossing semiconductor layer 120. However, magnetic field H can be used to change the spin direction and therefore change the conductivity G between contacts 140 and 150. When accounting for a rotation of the spins of electrons traversing semiconductor layer 120, angle θ is equal to the sum $θ_0+θ_H$ where angle $θ_0$ is the angle between the magnetizations $M_1$ and $M_2$ of magnetic materials 110 and 130 and angle $θ_H$ is the amount of spin rotation in semiconductor layer 120.

Under the action of the base voltage $V_b$, base current $J_b$ flows along nanowire 110 and induces a radially symmetrical magnetic field H having tangential directions around nanowire 110. Rotation angle $θ_H$ depends on magnetic field H in semiconductor layer 130. In particular, base voltage $V_b$ drives base current $J_b$ that flows along magnetic nanowire 110 and induces a radially symmetrical magnetic field H around magnetic nanowire 110. Equation (4) indicates the magnitude of magnetic field H in terms of base current $J_b$ and a radial distance p from the center of nanowire 110. Equation (4) is valid when the base current $J_b$ is static or varies with time (e.g., when $J_b(t)=J_{b0} \cos(ωt)$ with a frequency $ω<2π/τ_T$). When base current $J_b$ is greater than 25 mA and radius p in semiconductor layer 120 is less than about 40 nm, the magnitude of magnetic field H will be greater than about 1000 Oe. A very thin wire, i.e., a nanowire 110 having a radius less than about 40 nm can thus provide a strong enough magnetic field.

$$H=J_b/2πρ \quad (4)$$

The spins σ of the injected spin-polarized electrons precess in magnetic field H during transit through semiconductor layer 130. The spin rotation of an electron in a magnetic field H is well known to have an angular frequency $γH_n$ where the electron gyromagnetic ratio in vacuum γ is about $1.76×10^7 Oe^{-1}S^{-1}$ or $2.2×10^5 (m/A)S^{-1}$ and field component $H_n$ is the magnetic field component normal to the spin. In device 100, magnetic field H remains perpendicular to the spin direction, and component $H_n$ is equal to the magnitude of magnetic field H. The rotation angle $θ_H$ for the spin of an electron crossing semiconductor layer 120 is thus approximately given in Equations (5), where a variable $k_J$ is a gain factor, which is introduced to simplify Equation (5). The factor g below is the gyromagnetic factor, which is close to 2 in vacuum but may have a different value in the solid matrix of semiconductor layer 130.

$$θ_H = \frac{g}{2}γτ_t H = \frac{g}{2}γτ_t J_b(t)/2πρ \equiv k_J J_b(t), \quad (5)$$

$$k_J \equiv gγτ_t/4πρ$$

A square-law detector may be realized when magnetization $M_1$ is parallel or antiparallel to magnetization $M_2$. In these cases, angle $θ_0$ is equal to 0 or π, and Equation (3) simplifies to the form of Equation (6).

$$G=G_0(1±P_1P_2 \cos θ_H) \quad (6)$$

The emitter current $J_c$ flowing between magnetic layers 120 and 140 is equal to the product of bias voltage $V_c$ and the conductivity G of the emitter circuit. In accordance with Equations (5) and (6), when rotation angle $θ_H$ is less than or equal to about 1 radian, $\cos θ_H=1-θ_H^2/2$, and emitter current $J_c$ is given by Equation (7) to within an accuracy of 1%. In Equation (7), the coefficient $k_J$, is given by Equation (5). From Equation (7), one can see that the configuration where magnetizations $M_1$ and $M_2$ are antiparallel is preferable because the constant term, i.e., $J_{c0}(1-P_1P_2)$, is smaller relative to the time dependent term $ΔJ_c(t)$, which is given in Equation (8). The time dependent emitter current $ΔJ_c(t)$ being proportional to the square of base current $J_b(t)$ indicates that detector 100 functions as a square-law detector.

$$J_e = J_{e0}\left[1 ± P_1P_2\left(1-\frac{1}{2}θ_H^2\right)\right] \quad (7)$$

$$= J_{e0}(1 ± P_1P_2) \mp \frac{1}{2}J_{e0}P_1P_2k_J^2J_b^2(t)$$

$$ΔJ_e(t) = \frac{1}{2}J_{e0}P_1P_2k_J^2J_b^2(t) \propto J_b^2(t) \quad (8)$$

The response time of square-law detector 100 is on the order of the transit time $τ_T$ for electrons crossing semiconductor layer 130, which allows detector 100 to handle signals with ultrahigh frequency on the order of 100 GHz or more (as determined by $1/τ_T$). For example, square-law detector 100 can efficiently double the frequency of a signal $V_b$ or $J_b$ even at ultrahigh frequency ωo on the order of 100 GHz. Indeed when base current $J_b$ is of the form $J_{b0} \cos(ω_0t)$, the emitter current $J_c$ includes a component $ΔJ_c(2ω_0)$ with a frequency $2ω_0$ as indicated in Equation (9). The component having the double frequency can be extracted using a resonance amplifier with a resonant frequency $ω=2ω_0$.

$$ΔJ_e(2ω_0) = \frac{1}{4}J_{e0}P_1P_2k_J^2J_{b0}^2 \cos(2ω_0t) \quad (9)$$

Square-law detector 100 can also generate a signal having a difference frequency from ultrahigh frequency signals having frequencies up to 100 GHz or more. Indeed, when base current $J_b(t)$ contains two frequency components, for example, is of the form $J_g \cos(ω_Gt)+J_S \cos(ω_St)$ where $J_g$ and $J_S$ are currents from a reference generator and an input signal, the time dependent emitter current $ΔJ_c$ includes a component having the difference frequency $(ω_S-ω_G)$ as indicated in Equation 10. Equation 11 gives the gain $K_g$ for the component having difference frequency $(ω_S-ω_G)$ or a sum frequency $(ω_S+ω_G)$. A resonance amplifier with a resonant frequency $(ω_S-ω_G)$ or $(ω_S+ω_G)$ can be used to extract the desired difference or sum frequency.

$$\Delta J_e(\omega_S \mp \omega_G) = \frac{1}{2} J_{e0} P_1 P_2 J_g J_S \cos(\omega_S \mp \omega_G)t \quad (10)$$

$$K_g = \frac{1}{2} P_1 P_2 k_J^2 J_{e0} J_g \quad (11)$$

Equations (5), (9) and (11) illustrate that nanowire 110 and cylindrical layers 120 and 130 should have very small radii to provide suitable gain for amplification of a doubled, difference, or sum frequency in the emitter current $J_c$. In particular, semiconductor film 130 may have typical radius Ps less than about 30 to 50 nm. Indeed when radius $\rho_S$ is less than or equal to 30 nm and transit time $\tau_T$ greater than about $10^{-10}$ S the coefficient $k_J$, which is about equal to $\gamma\tau_T/\pi\rho_S$, is greater than $10^3$ A$^{-1}$, and the gain $K_g$ is greater than 100 at ultrahigh frequency of about 100 GHz when the product $J_{e0}J_g$ is greater than or equal to $10^{-4}$ A$^2$ even when the product $P_1P_2$ is as small as 0.1.

Figure 2A:
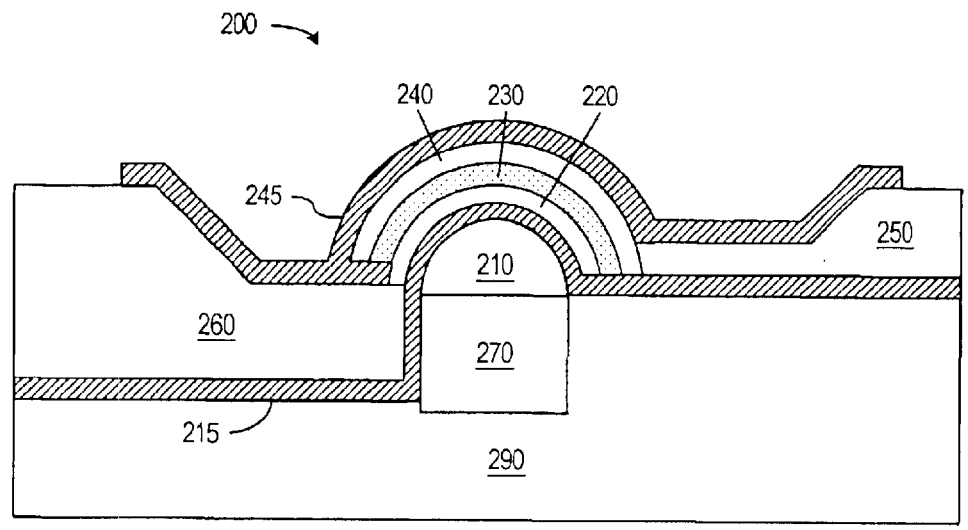
FIGS. 2A and 2B respectively show a cross-sectional view and a perspective view of a spin injection square-law detector according to an embodiment of the invention including a nanowire formed on a substrate.
Figure 2B:
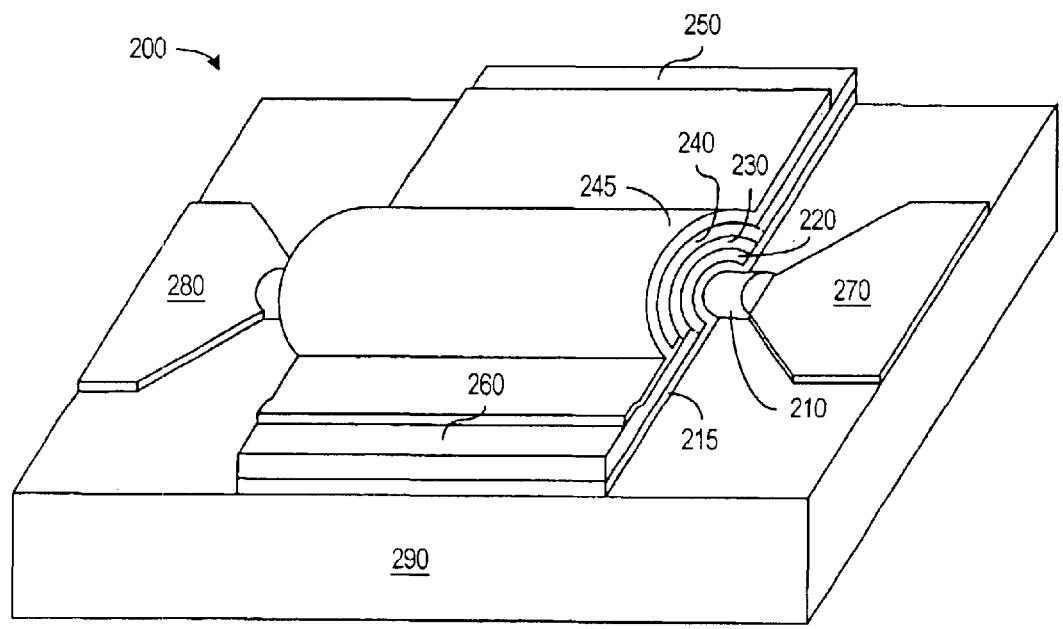

FIGS. 2A and 2B respectively show a cross-sectional view and a perspective view of a square-law detector 200 in accordance with another embodiment of the invention. Square-law detector 200 includes a conductive nanowire 210 that is nearly semicircular and covered by a thin dielectric layer 215, a first magnetic layer 220, a semiconductor layer 230, and a second magnetic layer 240. Electrodes 250 and 260 contact magnetic layers 220 and 240, and electrodes 270 and 280 contact the face planes (or ends) of nanowire 210. The composition of each of the elements 210, 215, 220, 230, 240, 250, 260, 270, and 280 can be the same as described above for corresponding elements 110, 115, 120, 130, 140, 150, 160, 170, and 180 of detector 100. Magnetic layers 220 and 240 have fixed magnetizations $M_1$ and $M_2$ that are preferably antiparallel or parallel to each other.

A base current $J_b$ in nanowire 210 creates in semiconductor layer 230 a magnetic field H that is about equal to that found in square-law detector 100 described above, when dimensions, materials, and currents of the devices are about the same. Accordingly, an emitter current $J_c$ that flows between magnetic layers 220 and 240 through semiconductor layer 230 for a constant emitter voltage $V_c$ will include a component proportional to the square of base current $J_b$ in nanowire 210 in substantially the same manner as indicated in Equation (7) above, and device 200 therefore operates as a square-law detector.

The radius $\rho_S$ of semiconductor layer 230 is preferably less than 100 nm, with radius $\rho_0$ of nanowire 210 obviously being less than the radius $\rho_s$ of semiconductor layer 230. The length of nanowire 210 can be on the order of about 1 $\mu$m but is more generally limited by acceptable maximum resistance of nanowire 210.

The thickness $d_1$ of magnetic layer 220 must be less than radius $\rho_s$ and is preferably less than a typical width $L_0$ of magnetic domain walls in the magnetic material. Usually, domain wall width $L_0$ is about 10–50 nm. When magnetic layer 220 has a thickness $d_1$ less than the width $L_0$ of magnetic domain walls but greater than 3 to 5 nm, the magnetization $M_1$ of thin magnetic film 220 lies in the film plane and can be directed along an axis of nanowire 210. The magnetization $M_2$ of magnetic film 240 also lies in the film plane and can be directed either in the same direction or the opposite direction as magnetization $M_1$.

The thickness d of semiconductor layer 230 between magnetic layers 220 and 240 is preferably greater than 10 nm but less than 100 nm.

The thickness w of dielectric layer 215 between nanowire 210 and magnetic layers 220 and 240 is preferably greater than 1 to 2 nm to isolate nanowire 210 from magnetic layers 220 and 240 but is preferably less than 10 to 20 nm. Since dielectric layer 215 isolates nanowire 210 from magnetic layer 220, the electrical circuits for base current $J_b$ and emitter current $J_c$ are independent. The conductivity G of the emitter circuit in detector 200 is much higher than the conductivity of the base circuit merely from geometry (i.e., the areas) of layers 220, 230, and 240 in detector 200.

In a fabrication process for detector 200, a substrate 290 is prepared to contain underlying conductive contacts such as part of electrodes 260, 270, and 280. The underlying contacts can be made of a conductive material such as a metal or a highly doped region of semiconductor material. Regions of insulating dielectric 215 can be provided in substrate 290 where required to isolate the conductive structures.

A layer of highly conductive material is then deposited on substrate 290 with a pattern that forms nanowire 210 in an area isolated from the contacts in substrate 290. The patterned material can be made by press forming and can be heated or otherwise liquefied so that beading provides the desired semicircular cross-section to nanowire 210. U.S. Pat. No. 6,432,740, which is incorporated by reference in its entirety, describes a suitable method for forming a nanowire of the appropriate size, but other methods could alternatively be used.

Additional portions of thin dielectric layer 215 are then grown and/or deposited on nanowire 210. Magnetic layer 220 is deposited to overlie dielectric layer 215 and nanowire 210 and to extend laterally far enough to make good contact with underlying terminal 260.

A portion of an insulating layer 245 is formed on terminal 260 before semiconductor layer 230 is deposited on magnetic layer 220, and a magnetic layer 240 is formed on semiconductor layer 230. Insulating layer 245 electrically insulates magnetic layer 220 and semiconductor layer 230 from terminal 260. A metal layer or other conductive layer forming terminal 250 is deposited in electrical contact with magnetic layer 240. The remainder of insulating dielectric layer 245 can then be deposited to provide insulation with openings for electrical connections to terminals 250, 260, 270, and 280.

Figure 3A:
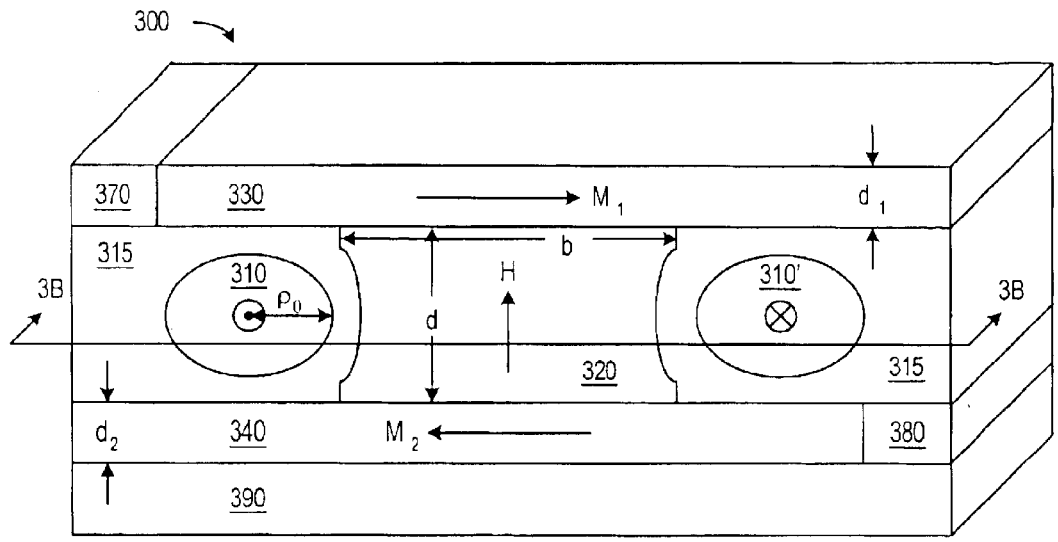
FIGS. 3A and 3B respectively show a cross-sectional view and a cutaway view of a spin injection square-law detector in accordance with an embodiment of the invention having a pair of parallel sections of nanowire that are horizontally spaced apart.
Figure 3B:
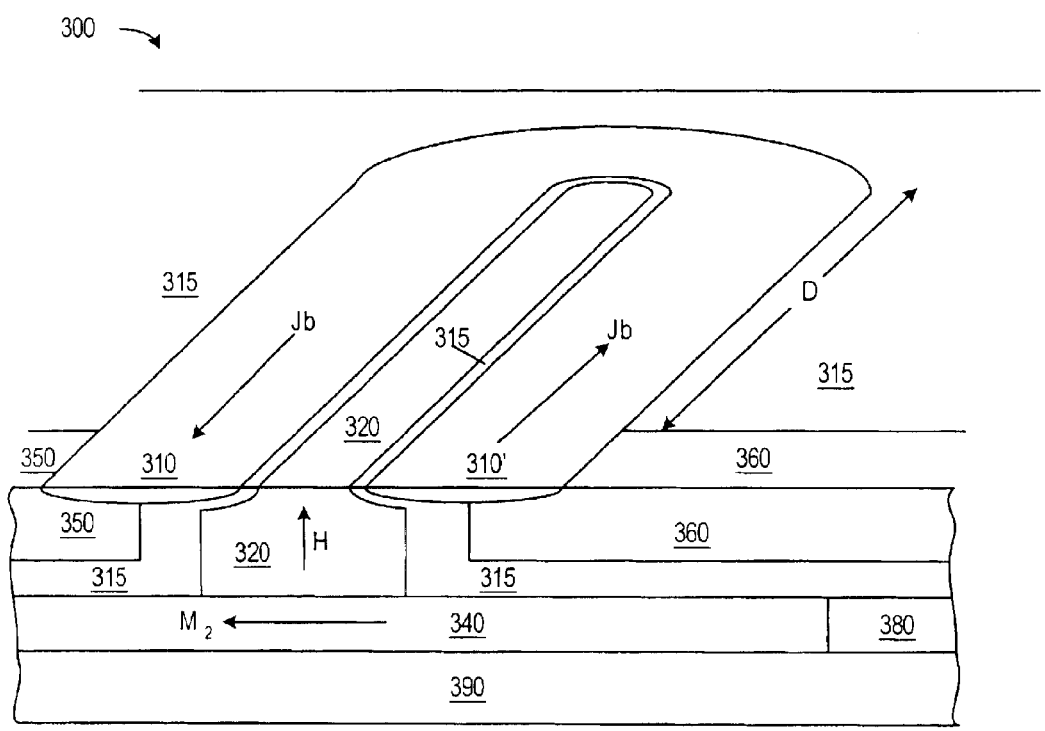

FIGS. 3A and 3B respectively show a cross-section and a cutaway view of a detector 300 having nanowire sections 310 and 310' that are serially connected and horizontally separated from each other. A thin semiconductor region 320 is between nanowire sections 310 and 310', and nanowire sections 310 and 310' and semiconductor layer 320 are sandwiched between an underlying magnetic layer 330 and an overlying magnetic layer 340. A dielectric layer 315 insulates nanowire sections 310 and 310' from semiconductor layer 320 and magnetic layers 330 and 340. Accordingly, electrical terminals 350 and 360 that respectively contact the ends of nanowire sections 310 and 310' can be biased to drive signal current $J_b$ through the nanowire, while electrical terminals 370 and 380 that respectively contact the magnetic films 330 and 340 are independently biased.

The radius $\rho_0$ of nanowire 310, the width b of semiconductor layer 320, and the thickness w of dielectric layer 315 should be controlled to provide a strong magnetic field in semiconductor layer 320. Generally, radius $\rho_0$ and width b should be less than about 100 nm, and thickness w is preferably greater than about 2 nm and less than width b. The thickness of semiconductor layer 320 should generally be less than about 100 nm for ultrafast response and spin ballistic transport of spin-polarized electrons through semiconductor layer 320.

Dielectric layer 315 isolates nanowire sections 310 and 310' from semiconductor layer 320 and magnetic layers 330 and 340, so that electrical circuits of the base and emitter currents, $J_b$ and $J_c$, are separated. The conductivity G of the emitter circuit, i.e., between the electrodes 370 and 380, is much higher than the conductivity of the base circuit, i.e., between the electrodes 350 and 360 merely from the geometry of the structure of square-law detector 300.

The series connection of the parallel sections 310 and 310' of nanowire cause the signal current $J_b$ to flow in one direction in one section 310 and flow in the opposite direction in the other section 310'. Both parallel sections 310 and 310' thus contributed to the magnetic field H in semiconductor region 320, and the magnitude of magnetic field H in semiconductor region 320 is about twice the magnetic field at the same distance from a single nanowire carrying the signal current $J_b$. The magnetic field H in semiconductor regions 320 is substantially vertical (e.g., up for a base current $J_b$ having the illustrated directions in FIG. 3A). The magnetization $M_1$ of magnetic layer 330 is in a plane of magnetic layer 330, so that magnetic layer 330 provides conduction electrons predominantly having a spin direction that is substantially perpendicular to the magnetic field H. Similarly, the magnetization $M_2$ can be in a plane of magnetic layer 340.

The cutaway view of FIG. 3B shows electrical terminals 350 and 360 contacting the ends of nanowire sections 310 and 310', respectively. As shown, dielectric layer 315 can insulate terminals 350 and 360 from semiconductor region 320, magnetic region 340, and terminal 380. FIG. 3A shows electrical terminals 370 and 380 contacting magnetic films 330 and 340, respectively.

FIG. 3A illustrates a configuration where magnetization $M_1$ in magnetic layer 330 is antiparallel to magnetization $M_2$ in magnetic layer 340, but more generally, magnetizations $M_1$ and $M_2$ can be substantially antiparallel or parallel to each other. The configuration of FIG. 3A can be realized, for example, when thicknesses d1 and d2 of magnetic layers 330 and 340 are greater than about 3 nm to 5 nm but equal to or less than the width $L_0$ of the domain walls in the magnetic materials of layers 330 and 340. The thin magnetic layers cause magnetizations $M_1$ and $M_2$ to lie in the respective planes of magnetic layers 330 and 340. Magnetic fields applied during formation of magnetic layers 330 and 340 can then control the respective directions of magnetizations $M_1$ and $M_2$. Additionally or alternatively, magnetization $M_2$ can be pinned to the desired direction using antiferromagnetic pinning layer made from an adjacent anti-ferromagnetic material such as FeMn, IrMn, NiO, MnPt ($L1_0$), or $\alpha\text{-}Fe_2O_3$ in substrate 390.

A fabrication process for detector 300 starts with a substrate 390 including an anti-ferromagnetic layer that defines a direction for magnetization $M_2$. A thin magnetic layer 340 having a thickness less than domain wall width $L_0$ but greater than 3 to 5 n is deposited on the anti-ferromagnetic layer to provide desired magnetization $M_2$. Magnetic layer 340 can then be patterned, and a metal contact 380 can be formed.

A semiconductor layer is deposited on magnetic layer 340 and patterned to form semiconductor region 320 of the desired dimensions. A thin conformal layer of an insulator can then be deposited/grown on magnetic layer 340 and/or semiconductor region 320, before depositing and patterning the conductive material for nanowire 310. The fabrication techniques described in U.S. Pat. No. 6,432,740 can be used to form nanowire 310 and/or semiconductor region 320. Although nanowire 310 is shown to have a rounded cross-section, the shape of the cross-section of nanowire 310 will generally depend on the formation technique and can have a form close to rectangular with end chamfer. Alternatively, nanowire 310 can be formed as two inverted trapezoids joined along the wide bases. Further insulating material for dielectric layer 315 can then be deposited on nanowire 310 and planarized by etchback or chemical mechanical polishing (CMP), at the level corresponding to the top of semiconductor region 320.

Magnetic region 330 having the desired magnetization $M_1$ is formed on semiconductor region 320 with possible extension onto dielectric layer 315. Terminal 370 can then be formed overlying dielectric layer 315 and in contact with magnetic region 330. Openings in dielectric layer 315 can also be formed to permit electrical contact to terminal 380 and to the ends of nanowire 310.

Figure 4:
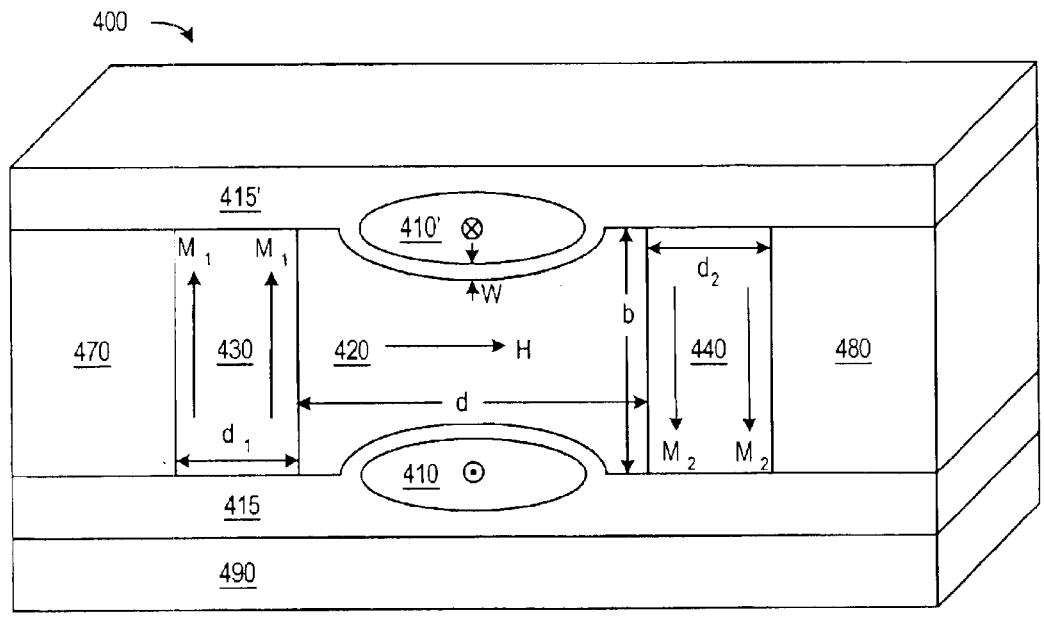
FIG. 4 shows a cross-section of a spin injection square-law detector in accordance with an embodiment of the invention having a pair of parallel sections of nanowire that are vertically spaced apart.

FIG. 4 illustrates a square-law detector 400 that also includes two nanowire sections 410 and 410' that are connected in series, but nanowire sections 410 and 410' are vertically separated from each other. Detector 400 further includes a thin semiconductor region 420 between nanowire sections 410 and 410', and nanowire sections 410A and 410A' and semiconductor layer 420 are sandwiched between laterally spaced magnetic regions 430 and 440. A dielectric layer 415 insulates nanowire sections 410 and 410' from semiconductor layer 420 and magnetic regions 430 and 440. The thickness w of the dielectric layer 415 between nanowire sections 410' or 410 and semiconductor layer 420 should preferably between about 2 run and about 10 nm.

Electrical terminals 470 and 480 contact respective magnetic regions 430 and 440.

A fabrication process for detector 400 can start by forming an insulating layer on a substrate 490. Nanowire section 410 can then be formed on the insulating layer, e.g., by press forming. Further insulation is then deposited or grown on nanowire 410 to complete insulating layer 415. Semiconductor region 420, magnetic region 430, magnetic region 440, contacts 470 and 480, insulating regions (not shown), and an end contact to nanowire 410 can then be formed on insulating layer 415. The order of formation of the regions can be varied since the regions abut each other without overlapping. A depression can be formed in semiconductor region 420 for nanowire 410'.

Part of insulating layer 415' is formed on semiconductor region 420, magnetic region 430, magnetic region 440, and contacts 470 and 480. A conductive plug contacting nanowire section 410 can be formed in an opening through insulating layer 415' and an underlying insulating region (not shown). Nanowire section 410' is then formed on insulating layer 415' by contacting the conductive plug to provide the series connection to nanowire section 410. The rest of insulating layer 415' and an end contact (not shown) to nanowire 410' can then be formed.

Figure 5:
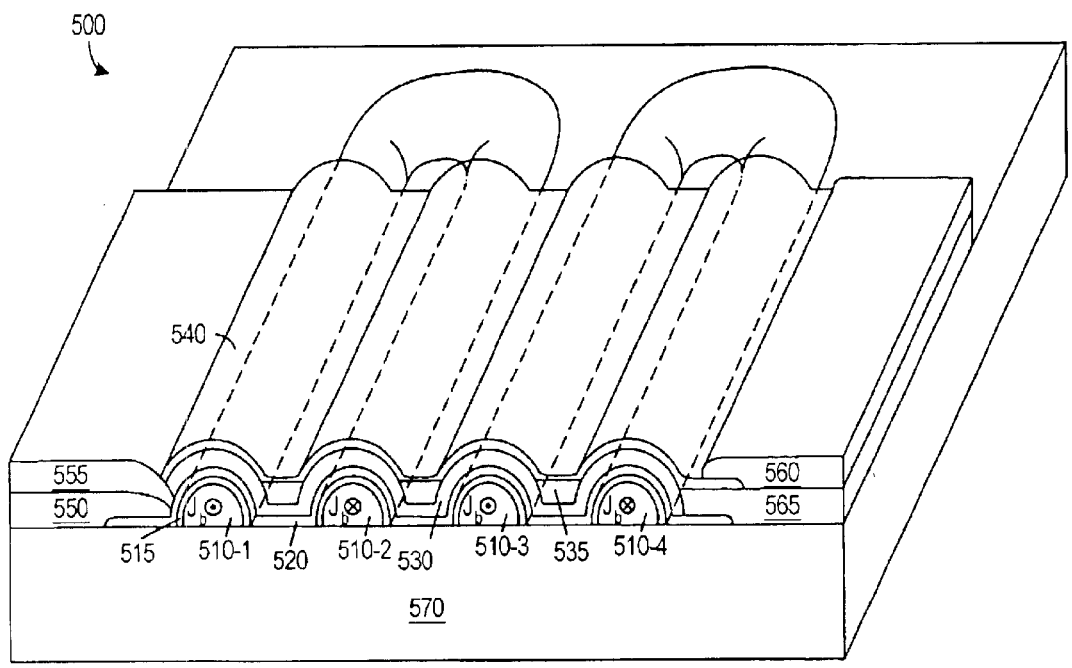
FIG. 5 illustrates a spin injection square-law detector in accordance with an embodiment of the invention including multiple parallel sections of nanowire.

FIG. 5 shows a spin injection square-law detector 500 based on magnetic, semiconductor, and conductive nanowires according to an embodiment of the invention including multiple parallel nanowire sections 510-1 to 510-4. As shown in FIG. 5, a dielectric layer 515, a bottom magnetic layer 520, a thin semiconductor layer 530, and a top magnetic layer 540 cover nanowire sections 510-1 to 510-4. Square-law detector 500 also includes electrodes 550 and 560 respectively contacting magnetic layers 520 and 540. Dielectric layers 555 and 565 insulate electrodes 550 and 560 from magnetic layers 540 and 520, respectively.

Nanowires 510-0 to 510-4 as illustrated in FIG. 5 are series connected in pairs. In particular, nanowires 510-0 and 510-1 are connected in series, and nanowires 510-3 and 510-4 are connected in series. The pairs can be connected in series or in parallel between electrodes (not shown) for application of the base current $J_b$.

The typical sizes of cross-sections of nanowire 510 and semiconductor layer 530 should be less than 100 nm. The thicknesses of magnetic layers 520 and 540 may be close to the thickness of semiconductor layer 530. The thickness w of the dielectric layer 515 between nanowire sections 510-0 to 510-4 and magnetic layer 520 should be greater than about 2 nm and less than about 10 mm.

Dielectric layer 515 isolates nanowire sections 510-0 to 510-4 from magnetic layer 520. Thus, the base circuit is separate from the emitter circuit and can be made from highly conductive materials such as poly-silicon or a metal such as Al, Cu, Pt, W, Au, or Ag. The conductivity G of the emitter circuit, i.e., between electrodes 550 and 560, is much higher than the conductivity of the base circuit of nanowire sections 510-0 to 510-4 merely from the geometry of the structure of square-law detector 500. In particular, detector 500 has multiple semiconductor regions that extend the length of nanowire sections 510-0 to 510-4 and therefore provide a long length of the current carrying area between magnetic layers 520 and 540. However, insulating regions 535 between nanowire sections 510-0 to 510-4 restrict injection of spin-polarized electrons to areas of semiconductor layer 530 that are adjacent individual nanowire sections 510-0 to 510-4. The magnetic field between nanowire sections 510-0 to 510-4 can vary significantly from the magnetic field adjacent the nanowire sections.

Magnetization $M_1$ in magnetic layer 520 may be substantially anti-parallel or parallel to the magnetization $M_2$ in magnetic layer 540. This situation can be easily realized for soft magnetic materials like permalloy, CoFe, Ni, or Fe because magnetostatic field vector of the magnetization would lie in the plane of magnetic layer 540. In films with appreciable surface magnetic anisotropy, when the easy magnetization axis may stick out of the plane, the thickness of the magnetic films, d1 and d2, may be selected to be equal to or less than the width $L_0$ of domain walls in the magnetic materials of magnetic layers 520 and 540 to keep the magnetizations $M_1$ and $M_2$ in the planes of magnetic layers 530 and 540.

Figure 6A:
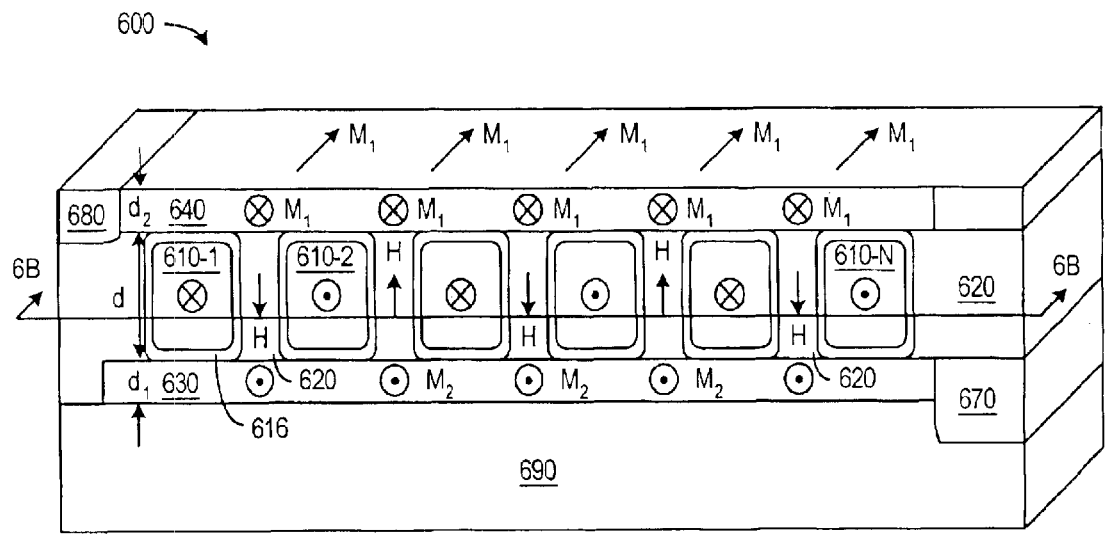
FIGS. 6A and 6B show a cross-sections of a spin injection square-law detector in accordance with an embodiment of the invention having a winding nanowire.
Figure 6B:
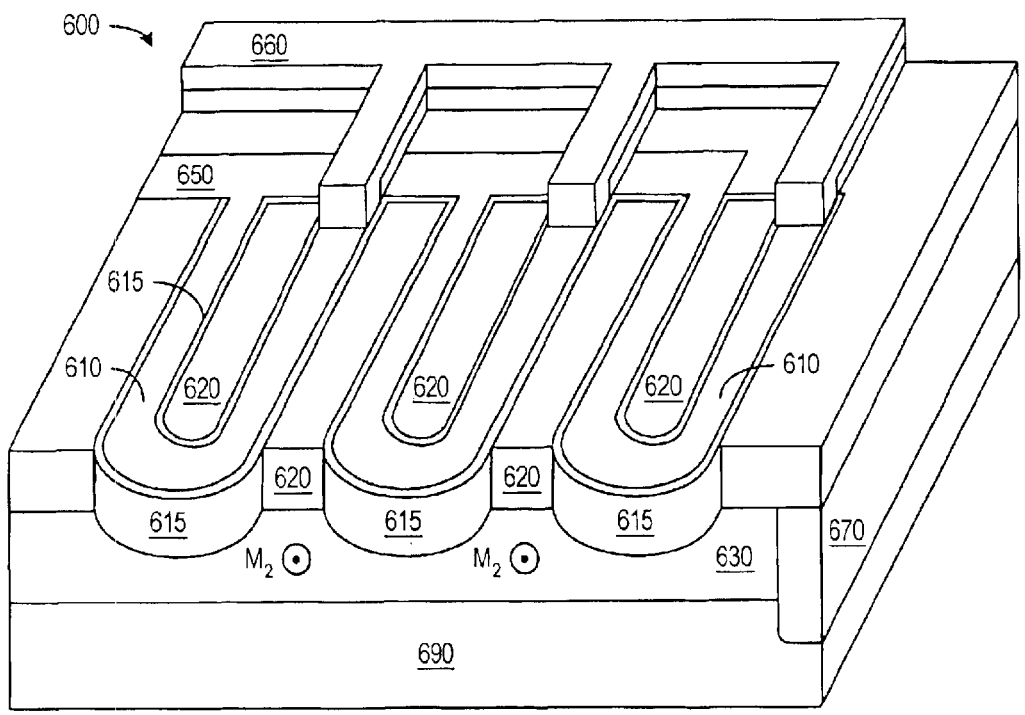

FIGS. 6A and 6B show another square-law detector 600 in accordance with an embodiment of the invention having a nanowire 610 that includes multiple parallel segments 610-1 to 610-N. FIG. 6A shows a cross-section cut vertically through nanowire 610 in detector 600, and FIG. 6B shows a cross-section of detector 600 partially cut horizontally along the line 6B—6B in FIG. 6A.

As shown in FIGS. 6A and 6B, nanowire 610 in detector 600 includes several parallel sections 610-1 to 610-N with each section being in series with an adjacent section. The pairs of sections are connected in parallel between terminals 650 and 660. Thin semiconductor regions 620 are between parallel sections 610-1 to 610-N, and nanowire 610 and semiconductor regions 620 are sandwiched between two vertically separated magnetic films 630 and 640. A dielectric layer 615 separates nanowire 610 from semiconductor regions 620 and magnetic films 630 and 640.

Contacts 670 and 680 for the emitter circuit respectively provide electrical connections to magnetic layers 630 and 640, and contacts 650 and 660 for the base circuit provide electrical connections to nanowire 610. When a base voltage $V_b$ is applied across contacts 650 and 660, the resulting currents in nanowire sections 610-1 to 610-N alternate in direction as shown in FIG. 6A, so that adjacent nanowire sections reinforce the magnetic field in the intervening semiconductor regions 620. The emitter current that results from applying a fixed emitter voltage $V_c$ between contacts 670 and 680 will thus depend on the base current $J_b$, but the emitter current $J_c$ can be significantly amplified because of the large area of semiconductor regions 620 which conduct the emitter current $J_c$ between magnetic regions 630 and 640.

In the configuration shown in FIG. 6B, base voltage $V_b$, when applied to terminals 650 and 660, drives a base current $J_b$ that is split among the pairs of parallel nanowire sections. The splitting of the base current $J_b$ reduces the resistance of the base circuit but also reduces the magnetic field strength in semiconductor regions 620 and therefore the spin rotation angle $\theta_H$. Alternatively, all of the parallel nanowire sections can be connected in series. A series connection has greater resistance but also permits the undivided base current to flow along each nanowire sections.

Figure 7:
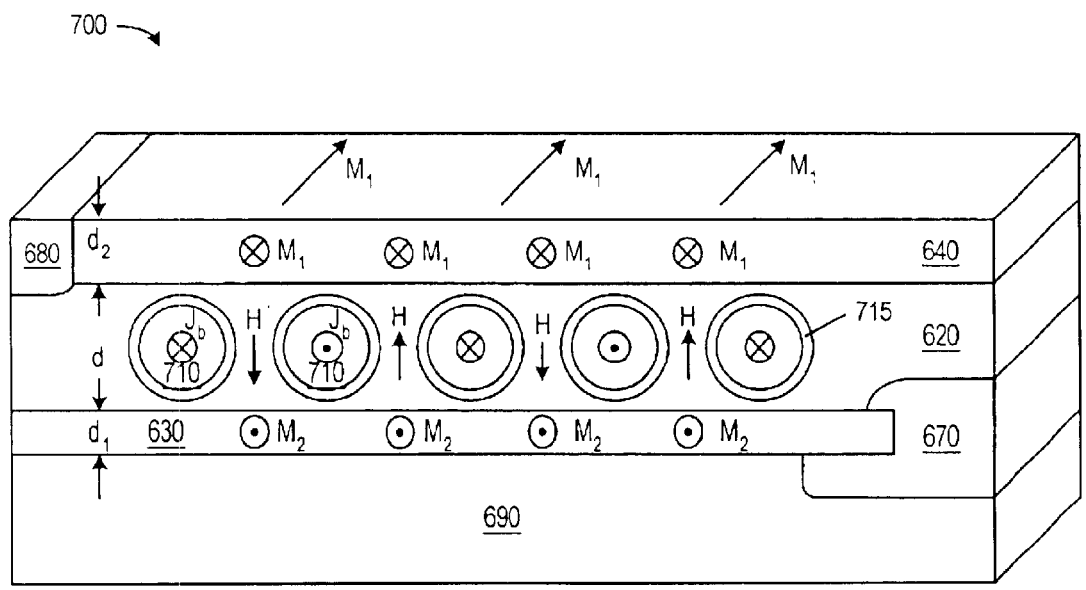
FIG. 7 shows a square-law detector having a nanowire with an alternative shape when compared to the square-law detector of FIG. 6A.

FIG. 7 shows a square-law detector 700 that is similar to square layer detector 600 of FIGS. 6A and 6B. Square-law detector 700 differs from square-law detector 600 in that nanowire 710 and has a circular cross-section instead of the squared cross-section shown in FIG. 6A.

A fabrication process for square-law detector 600 or 700 can begin with formation of magnetic layer 630 and its associated contact 670 in and on a substrate 690. A semiconductor layer can then be deposited/patterned to leave semiconductor regions 620 and a trench for nanowire 610 and one of contacts 650 and 660. A thin insulating layer can be grown or deposited in the trench, leaving space for a conductive material that is deposited to form nanowire 610. A capping insulating layer can be formed on nanowire 610 before the structure is etched back or planarized to expose the tops of semiconductor regions 620. Magnetic layer 640 is formed on semiconductor regions 620. Electrical contacts to nanowire 610 and magnetic layers 630 and 640 can be laterally spaced from each other and made through openings in an insulating layer (not shown).

The magnetization $M_1$ in magnetic film 630 is antiparallel to the magnetization $M_2$ in magnetic film 640 as shown in FIG. 6A. Alternatively, magnetizations $M_1$ and $M_2$ can be parallel. Magnetizations $M_1$ and $M_2$ preferably lie in the respective planes of magnetic films 630 and 640. To achieve this, the thicknesses $d_1$ and $d_2$ of magnetic films 630 and 640 can be made equal to or less than the width $L_0$ of a domain wall in the magnetic materials used in magnetic films 630 and 640, so that the magnetization $M_1$ or $M_2$ will lie in the plane of the film, being forced in there by the magnetostatic interactions. The magnetization $M_2$ in magnetic film 630 can be pinned using an antiferromagnetic pinning layer in substrate 690.

The typical size $\rho_0$ of cross-section of nanowire 610 and the thickness d of the semiconductor layer 620 may be equal to or less than 100 nm. The thickness of the dielectric layers 615 between semiconductor layers 620 and nanowires 610 should be greater than 1 to 2 nm but less than 30 nm.

Although the invention has been described with reference to particular embodiments, the description is only an example of the invention'S application and should not be taken as a limitation. Many additions or variations can be applied in the disclosed square-law detectors. For example, antiferromagnetic layers made of a material such as FeMn, IrMn, NiO, MnPt ($L1_0$), or $\alpha$-$Fe_2O_3$ can be added to fix the directions of magnetizations $M_1$ and $M_2$ in the respective magnetic films. One anti-ferromagnetic layer may be added between the substrate (e.g., substrates 390, 490, 570, and 690) and the lower magnetic film (e.g., magnetic layers 340, 430 and 530), and another anti-ferromagnetic layer may be formed on the upper magnetic film (e.g., magnetic layers 330, 440 and 540).

Additionally, when ferromagnetic metals Ni, Fe, and/or Co are used as magnetic layers in the structures described above, "δ-doped" layers, which are semiconductor layers that are extremely thin and very heavily doped with n-type dopants, may be formed between semiconductor and magnetic layers, i.e., the δ-doped layers may be located inside the ferromagnetic-semiconductor junction. The specifications of some suitable δ-doped layers are set forth in U.S. patent application Ser. No. 10/284,183, filed Oct. 31, 2002, entitled: "Efficient Spin-Injection Into Semiconductors" and U.S. patent application Ser. No. 10/284,360, filed Oct. 31, 2002, entitled: "Magnetic Sensor Based on Efficient Spin Injection into Semiconductor".

Various other adaptations and combinations of features of the embodiments disclosed are within the scope of the invention as defined by the following claims.

What is claimed is:

1. A device comprising:
   a first magnetic region having a first magnetization;
   a control region forming a first interface with the first magnetic region;
   a second magnetic region forming a second interface with the control region, the second magnetic region having a second magnetization that is substantially collinear with the first magnetization; and
   a wire positioned relative to the control region so that a current through the wire creates in the control region a magnetic field that rotates spins of the electrons injected through the control region between the first magnetic region and the second magnetic region.

2. The device of claim 1, wherein the first magnetization and the second magnetization are substantially parallel to each other.

3. The device of claim 1, wherein the first magnetization and the second magnetization are substantially anti-parallel to each other.

4. The device of claim 1, further comprising:
   a first terminal connected to the first magnetic region;
   a second terminal connected to the second magnetic region; and
   a third terminal and a fourth terminal connected to ends of the wire, wherein a signal applied to the third and fourth terminals controls a current between the first and second terminals.

5. The device of claim 4, wherein the current between the first and second terminals includes a component that is proportional to the square of a current that the signal causes in the wire.

6. The device of claim 4, wherein the signal oscillates with a first frequency, and the current between the first and second terminals includes a component that oscillates with a second frequency that is twice the first frequency.

7. The device of claim 4, wherein the signal includes a first component that oscillates with a first frequency and a second component that oscillates with a second frequency, and the current between the first and second terminals includes a component that oscillates with a third frequency that is equal to a difference between the first frequency and the second frequency.

8. The device of claim 4, wherein the signal includes a first component that oscillates with a first frequency and a second component that oscillates with a second frequency, and the current between the first and second terminals includes a component that oscillates with a third frequency that is equal to a sum of the first frequency and the second frequency.

9. The device of claim 1, wherein the control region is such that an electron spin relaxation time of the control region is longer than a transit time of the electrons traversing the control region.

10. The device of claim 1, wherein the control region comprises a semiconductor material.

11. The device of claim 10, wherein the semiconductor material is selected from a group consisting of Si, Ge, GaAs, GaInAs, Ge, ZnSe, ZnCdSe, and alloys and combinations of these materials.

12. The device of claim 10, wherein the semiconductor material contains an n-type doping.

13. The device of claim 1, wherein the first magnetic region comprises a ferromagnetic material.

14. The device of claim 1, wherein the wire has a cross-sectional dimension less than 100 nm.

15. The device of claim 1, wherein the control region has a thickness less than 100 mm.

16. The device of claim 1, further comprising a substrate wherein:
   the wire comprises a conductive region on the substrate;
   the first magnetic region overlies the conductive region;
   the control region overlies the first magnetic region; and
   the second magnetic region overlies the control region.

17. The device of claim 16, further comprising an insulating layer between the conductive region and the first magnetic region.

18. The device of claim 16, wherein the insulating layer has a thickness that is greater than 1 nm and less than 20 nm.

19. The device of claim 1, further comprising:
   a first anti-ferromagnetic layer adjacent to the first magnetic region, wherein the first anti-ferromagnetic layer fixes a direction of the first magnetization; and
   a second anti-ferromagnetic layer adjacent to the second magnetic region, wherein the second anti-ferromagnetic layer fixes a direction of the second magnetization.

20. The device of claim 1, further comprising:
   a first δ-doped layer between the first magnetic region and the control region; and
   a second δ-doped layer between the second magnetic region and the semiconductor control region, wherein the first and second δ-doped layers increase tunneling transparency of the first and second interfaces.

21. The device of claim 1, further comprising a substrate wherein:
   the first magnetic region is on the substrate;
   the control region overlies the first magnetic region; and
   the second magnetic region overlies the control region.

22. The device of claim 21, wherein the substrate comprises an anti-ferromagnetic material that is under the first magnetic region and that fixes the direction of first magnetization.

23. The device of claim 21, wherein the wire comprises a first segment laterally spaced from a first side of the control region.

24. The device of claim 23, wherein the wire further comprises a second segment laterally spaced from a second side of the control region.

25. The device of claim 24, wherein the first segment and the second segment are connected in series such that current in the first segment has a direction opposite to current in the second segment.

26. The device of claim 21, wherein:
   the control region comprises a plurality of parts, wherein each part is laterally separated from an adjacent part, and the wire comprises a plurality of segments that reside in separations between the parts of the control region.

27. The device of claim 26, wherein the segments are connected such that current in each of the segments has a direction opposite to current in an adjacent one of the segments.

28. The device of claim 1, further comprising a substrate, wherein the first magnetic region, the second magnetic region, and the control region are along a surface of the substrate, with the control region being between the first magnetic region and the second magnetic region.

29. The device of claim 28, wherein the wire comprises a first section overlying the control region.

30. The device of claim 28, wherein the substrate comprises a inductive section that underlies the control region and forms at least a part of the wire.

31. The device of claim 30, wherein the wire further comprises a second section that overlies the control region and that is connected in series with the inductive section in the substrate.

32. A method for generating an output signal having a frequency differing from that of an input signal, comprising:

applying a first voltage difference between a first magnetic region and a second magnetic region that respectively form a first interface and a second interface with a semiconductor region that is between the first and second magnetic regions;

driving the input signal current through a wire that is adjacent to the semiconductor region to create a magnetic field that rotates spins of electrons injected through the semiconductor region between the first magnetic region and the second magnetic region; and extracting the output signal from a current resulting from injection of spin-polarized electrons between the first magnetic region and the second magnetic region.

33. The method of claim 32, wherein the frequency of the output signal is twice that of the input signal.

34. The method of claim 32, wherein the input signal includes a first component having a first frequency and a second component having a second frequency, and the frequency of the output signal is equal to a difference between the first frequency and the second frequency.

35. The method of claim 32, wherein the input signal includes a first component having a first frequency and a second component having a second frequency, and the frequency of the output signal is equal to a sum of the first frequency and the second frequency.

36. The method of claim 32, wherein the first magnetic region has a first magnetization, the second magnetic region has a second magnetization, and the first magnetization is substantially collinear with the second magnetization.

37. The method of claim 32, wherein the semiconductor region is such that an electron spin relaxation time of the semiconductor region is longer than a transit time of the electrons traversing the semiconductor region.

* * * * *